US009899082B2

(12) United States Patent
Katayama

(10) Patent No.: US 9,899,082 B2
(45) Date of Patent: Feb. 20, 2018

(54) SEMICONDUCTOR MEMORY DEVICE

(71) Applicant: TOSHIBA MEMORY CORPORATION, Minato-ku, Tokyo (JP)

(72) Inventor: Akira Katayama, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/261,810

(22) Filed: Sep. 9, 2016

(65) Prior Publication Data

US 2017/0256313 A1    Sep. 7, 2017

Related U.S. Application Data

(60) Provisional application No. 62/303,335, filed on Mar. 3, 2016.

(51) Int. Cl.
G11C 13/00    (2006.01)

(52) U.S. Cl.
CPC ...... *G11C 13/0069* (2013.01); *G11C 13/0026* (2013.01); *G11C 13/0028* (2013.01); *G11C 13/0061* (2013.01)

(58) Field of Classification Search
None
See application file for complete search history.

(56) References Cited

U.S. PATENT DOCUMENTS

| 2006/0013038 A1 | 1/2006 | Kaiyang et al. |
| 2009/0141544 A1 | 6/2009 | Sakimura et al. |
| 2010/0027315 A1* | 2/2010 | Kim ............... G11C 8/12 365/148 |
| 2015/0332748 A1* | 11/2015 | Wang ............. G11C 11/165 365/158 |

FOREIGN PATENT DOCUMENTS

JP    2010283370 A    12/2010

* cited by examiner

*Primary Examiner* — James G Norman
(74) *Attorney, Agent, or Firm* — Holtz, Holtz & Volek PC

(57) ABSTRACT

According to one embodiment, a semiconductor memory device includes: a first memory cell including a first variable resistance element; a first buffer coupled to the first memory cell; a second memory cell including a second variable resistance element; and a second buffer coupled to the second memory cell. In data write, first data is stored in the first buffer and is transferred to the first memory cell, and second data is stored in the second buffer and is transferred to the second memory cell, and a start of the transferring the first data and the second data is based on a first data transfer signal.

10 Claims, 10 Drawing Sheets

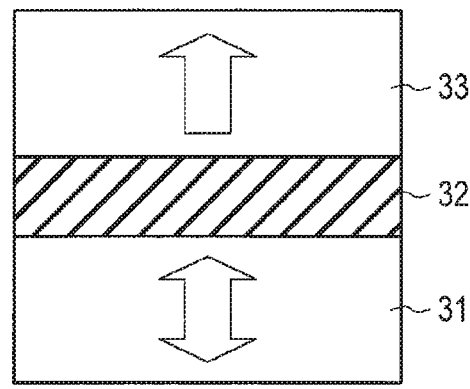
F I G. 3A
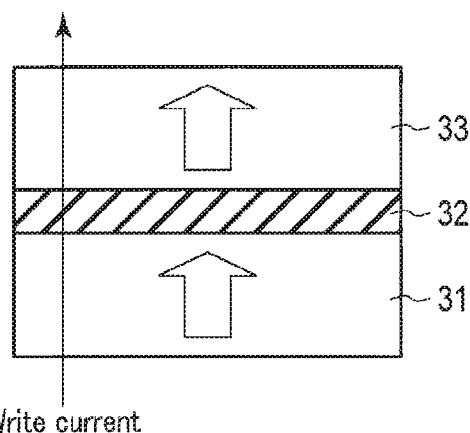
F I G. 3B  Parallel state (low resistance)
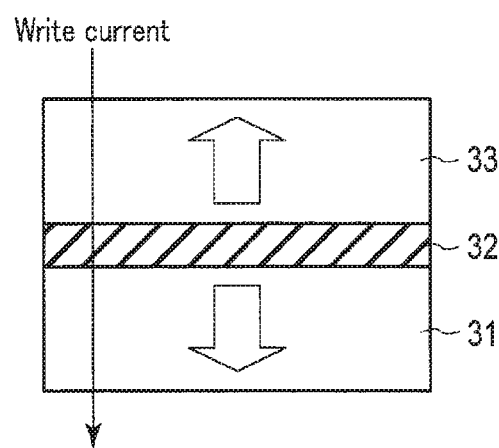
F I G. 3C  Anti-parallel state (high resistance)

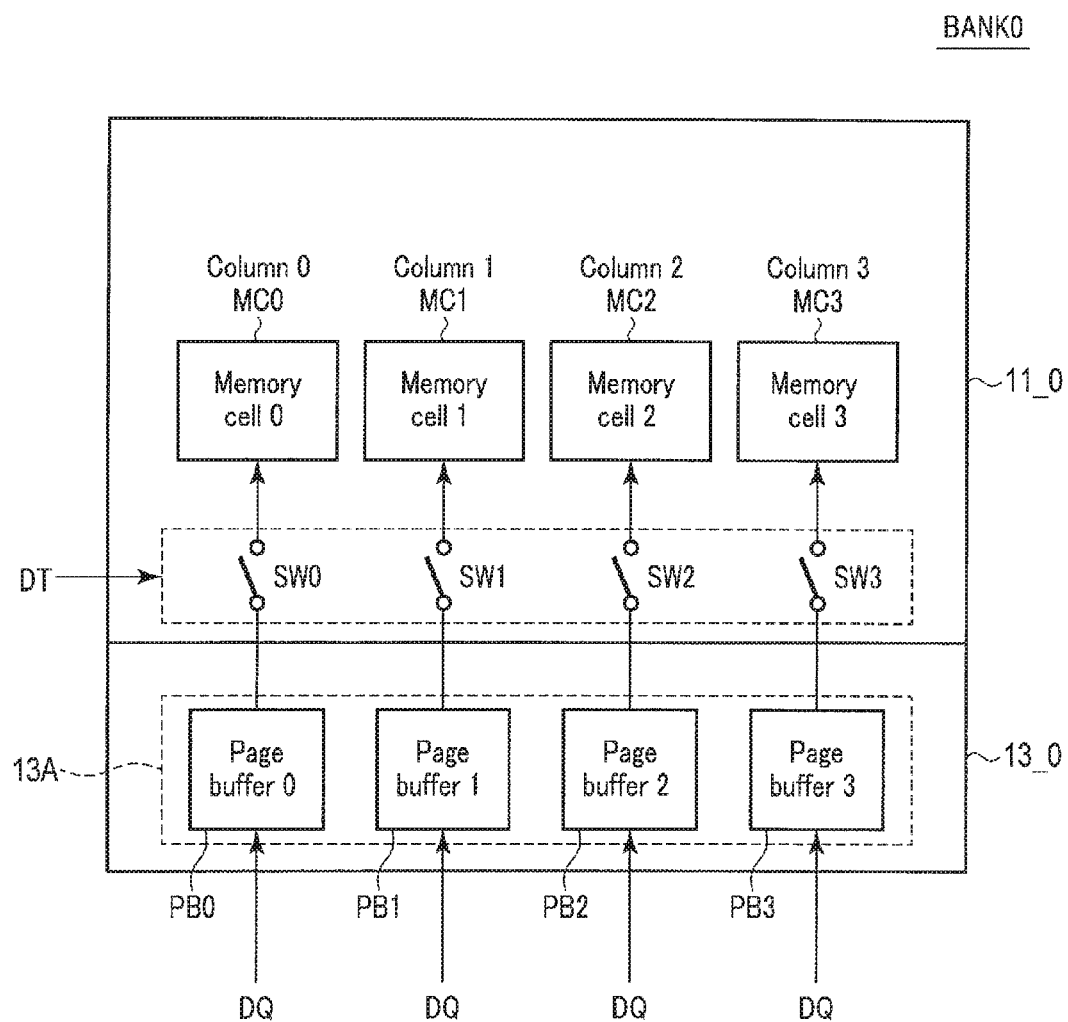
F I G. 4

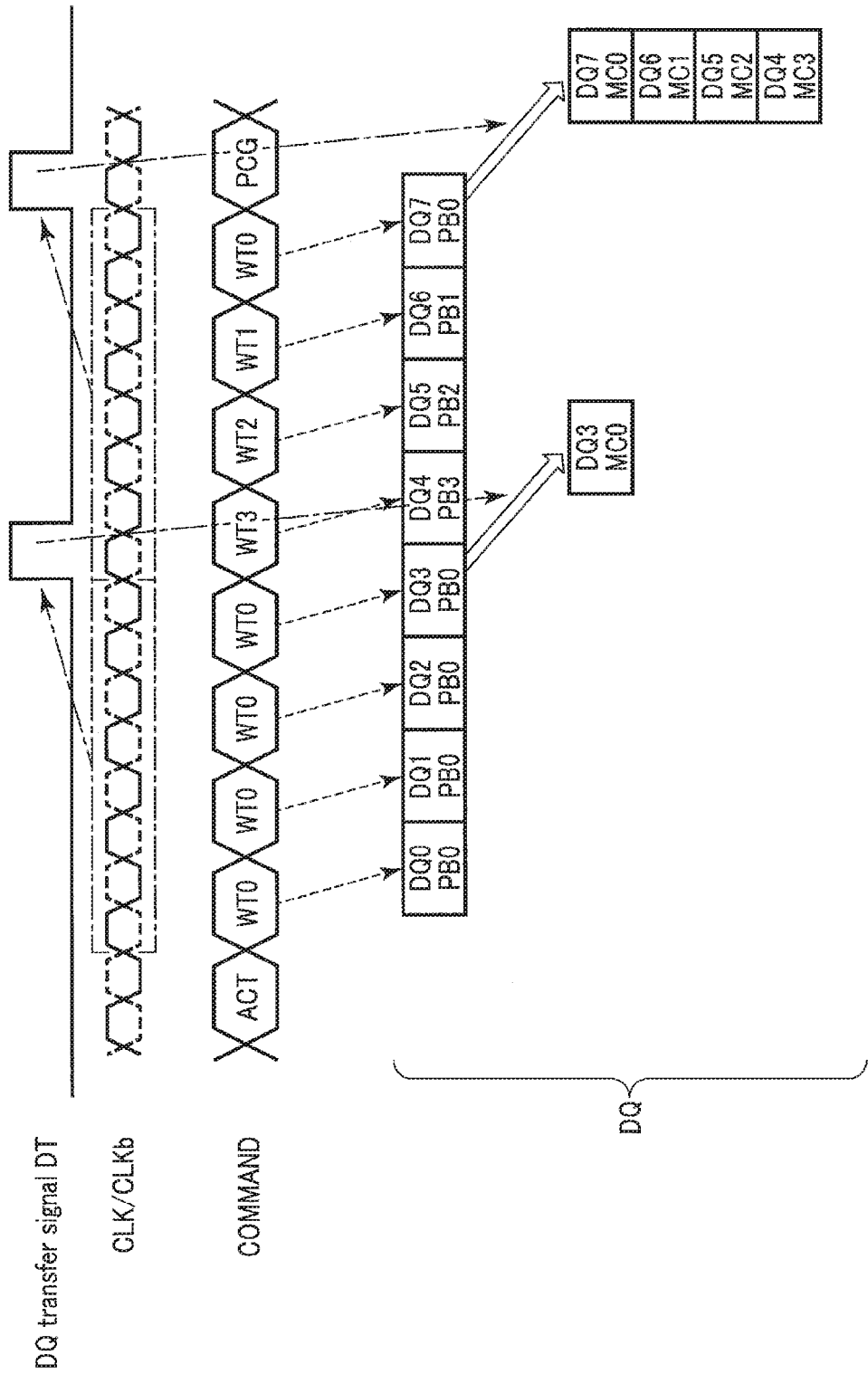
F I G. 6

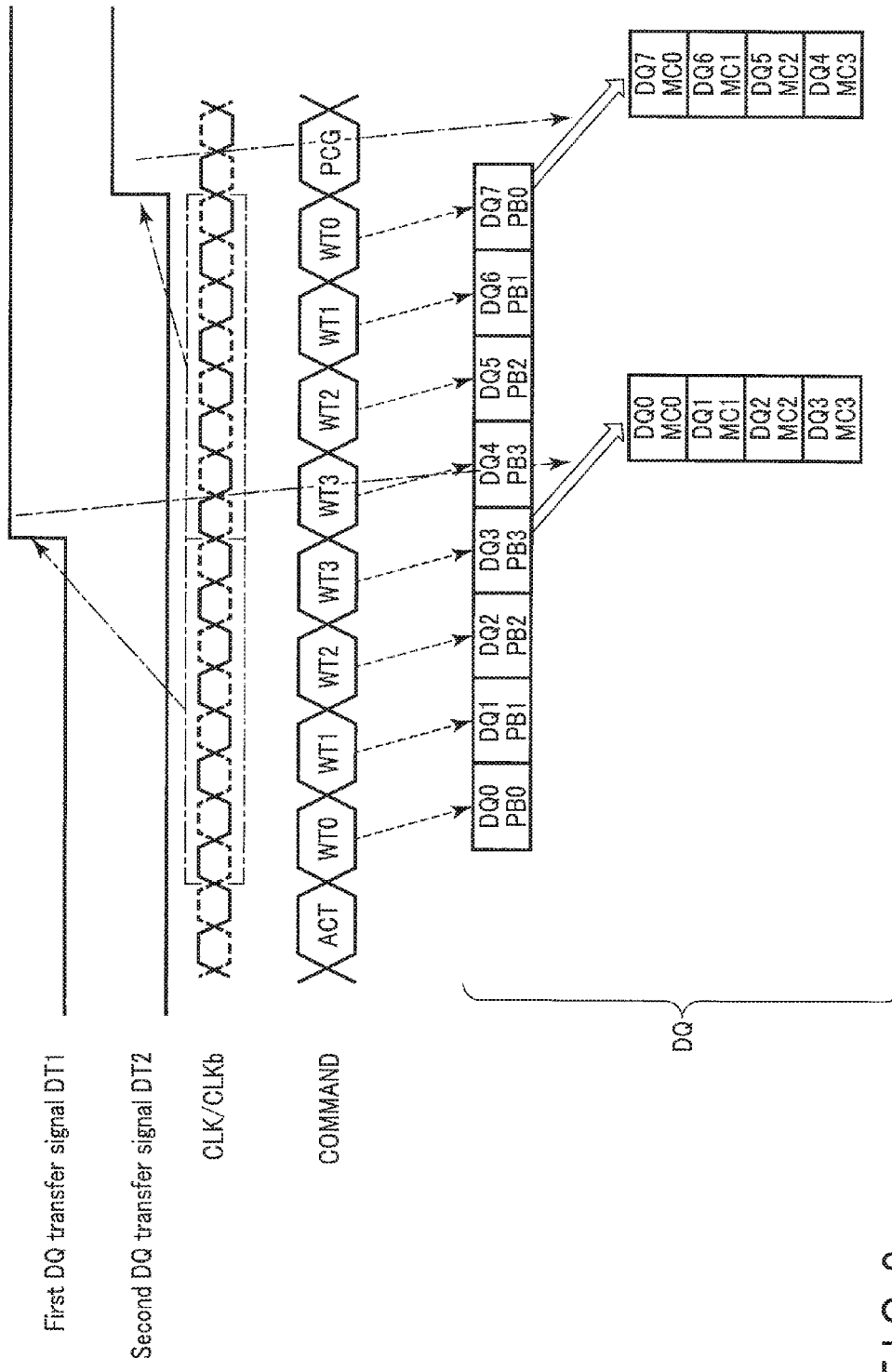
F I G. 9

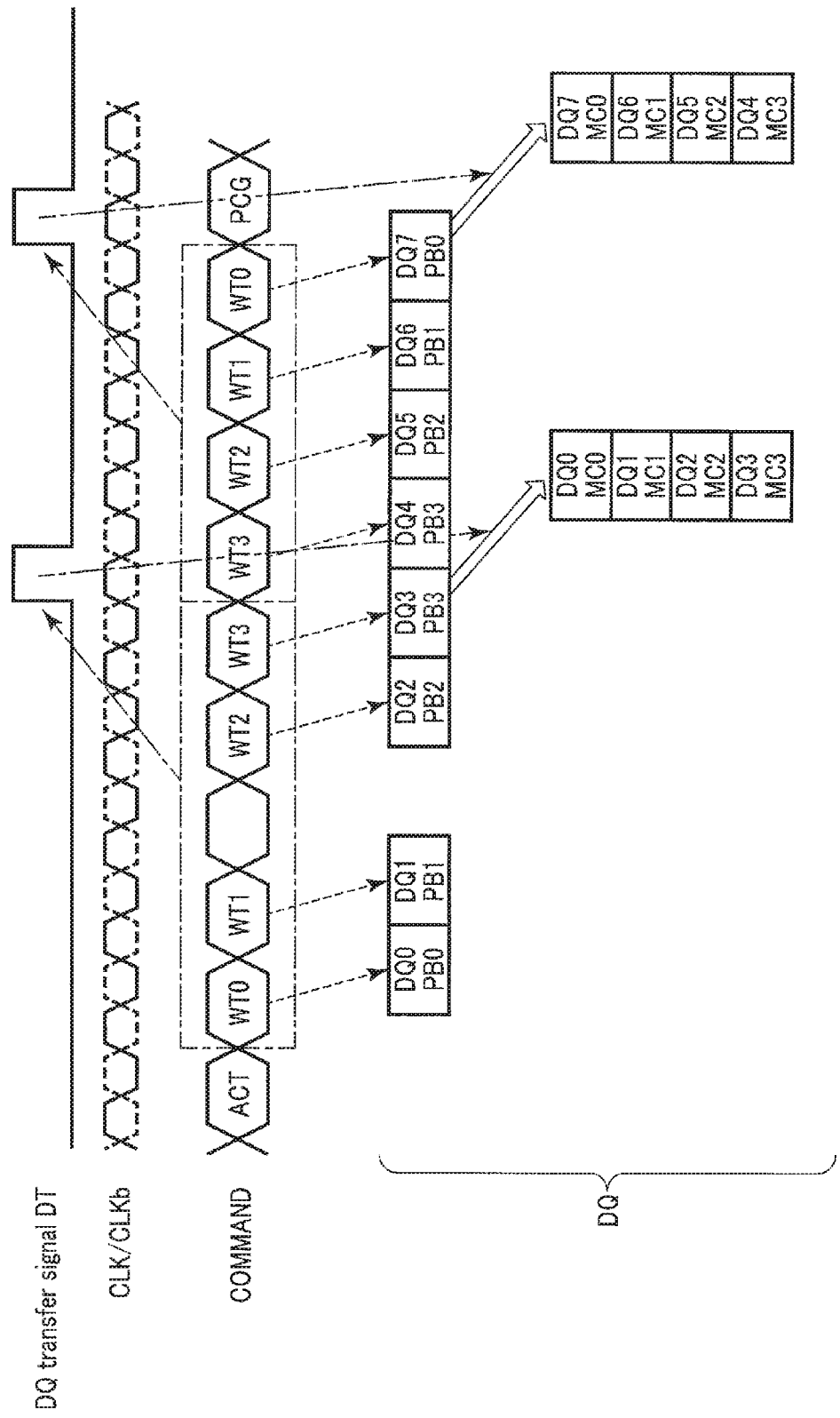
F I G. 10

US 9,899,082 B2

SEMICONDUCTOR MEMORY DEVICE

CROSS REFERENCE TO RELATED APPLICATIONS

This application is based upon and claims the benefit of priority from U.S. Provisional Application No. 62/303,335, filed Mar. 3, 2016, the entire contents of all of which are incorporated herein by reference.

FIELD

Embodiments described herein relate generally to a semiconductor memory device.

BACKGROUND

A Magnetic Random Access Memory (MRAM) is a memory device which uses a storage element having a magnetoresistive effect on a memory cell for storing information. The MRAM is receiving attention as a next-generation memory device characterized by high-speed operation, large storage capacity, and non-volatility.

BRIEF DESCRIPTION OF THE DRAWINGS

FIG. 3A is a cross-sectional view showing an outline configuration of a variable resistance element in the semiconductor memory device according to the first embodiment.

FIG. 3B is a diagram to explain a write at the variable resistance element in the semiconductor memory device according to the first embodiment, and is a cross-sectional view of the variable resistance element in a P state.

FIG. 3C is a diagram to explain a write at the variable resistance element in the semiconductor memory device according to the first embodiment, and is a cross-sectional view of the variable resistance element in an AP state.

FIG. 4 is a block diagram showing the memory cell array and a read/write circuit in the semiconductor memory device according to the first embodiment.

FIG. 6 is a timing chart showing a second example of the write at the semiconductor memory device according to the first embodiment.

FIG. 9 is a timing chart showing a modification of the write at the semiconductor memory device according to the first embodiment.

FIG. 10 is a timing chart showing a write at the semiconductor memory device according to a second embodiment.

DETAILED DESCRIPTION

Figure 1:
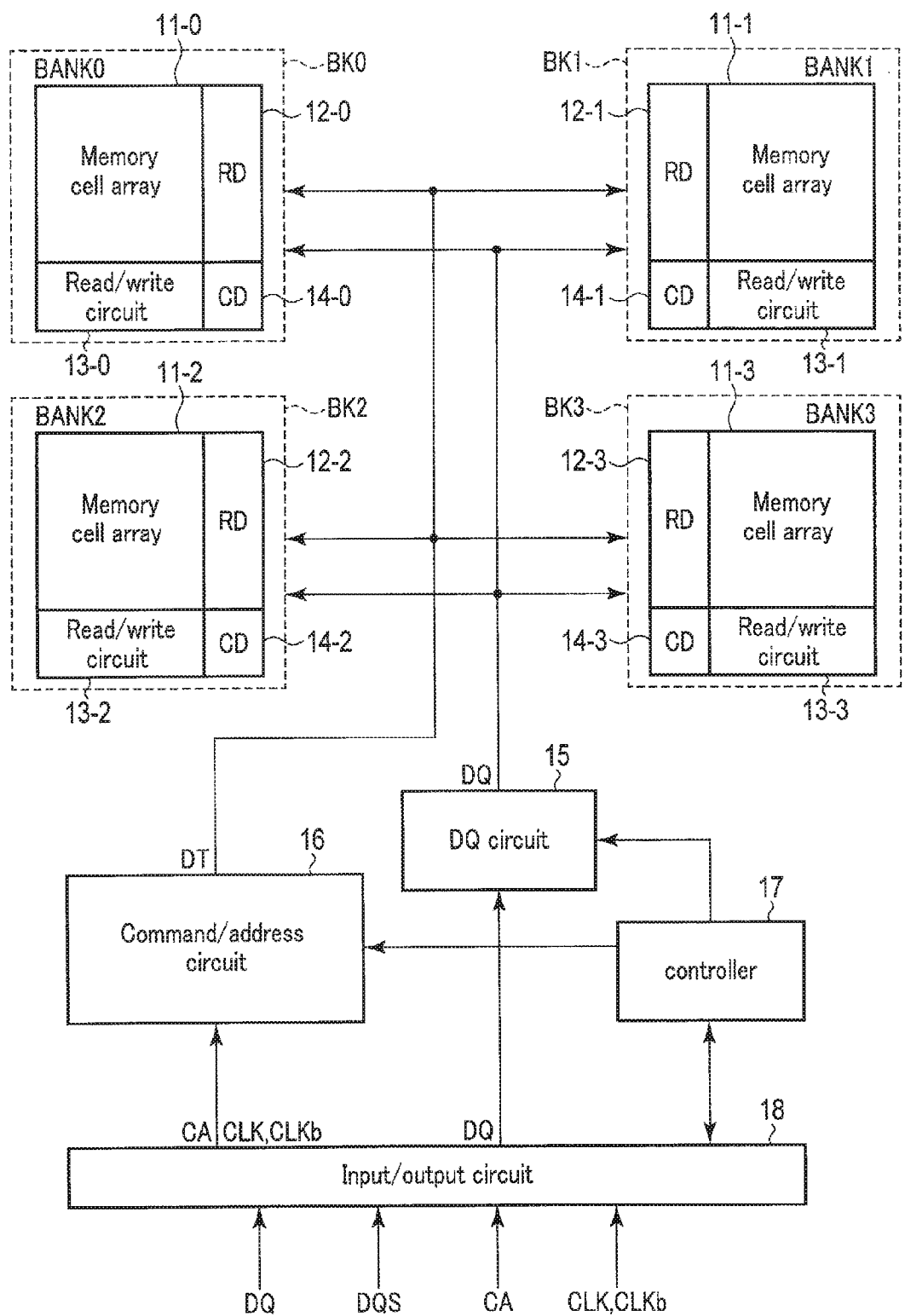
FIG. 1 is a block diagram showing an entire structure of a semiconductor memory device according to a first embodiment.

In general, according to one embodiment, a semiconductor memory device includes: a first memory cell including a first variable resistance element; a first buffer coupled to the first memory cell; a second memory cell including a second variable resistance element; and a second buffer coupled to the second memory cell. In data write, first data is stored in the first buffer and is transferred to the first memory cell, and second data is stored in the second buffer and is transferred to the second memory cell, and a start of the transferring the first data and the second data is based on a first data transfer signal.

Hereinafter, the present embodiments will be described with reference to the drawings. In the drawings, identical reference symbols will be applied to those parts that are identical.

<First Embodiment>

A semiconductor memory device according to a first embodiment will be explained in the following using FIGS. 1, 2, 3, 4, 5, 6, and 8.

Herein, an MRAM for storing data using a magnetoresistive effect element (an MTJ element) as a variable resistance element is explained as an example, but is not limited thereto. The present embodiment is applicable to any general memory (for example ReRAM or PCRAM) which senses a resistance difference between variable resistance elements by converting the resistance difference into a current difference or a voltage difference. Note that in the following explanation the term "connect (couple)" should be construed to include not only a direct connection, but also a connection through any intervening element, unless otherwise mentioned in particular. Also note that one end of a transistor indicates one of a source or a drain, and the other end indicates one of the other source or drain.

[Configuration in First Embodiment]

FIG. 1 is a block diagram showing the entire configuration of the semiconductor memory device (MRAM) according to the first embodiment.

As shown in FIG. 1, the semiconductor memory device comprises banks BK (BK0-BK3), a data circuit 15, a command/address circuit 16, a controller 17, and an input output circuit 18.

The bank BK0 comprises a memory cell array 11_0, a row decoder 12_0, a read/write circuit 13_0, and a column decoder 14_0. Each of the banks BK 1 to BK 3 has the same configuration as the bank BK0, in other words, comprises memory cell arrays 11_1 to 11_3, row decoders 12_0 to 12_3, read/write circuits 13_0 to 13_3, and column decoders 14_0 to 14_3, respectively. In the following, the configuration of bank BK0 will be explained as an example. Here, the bank BK is the largest activation unit selectable from outside (unillustrated controller).

Figure 2:
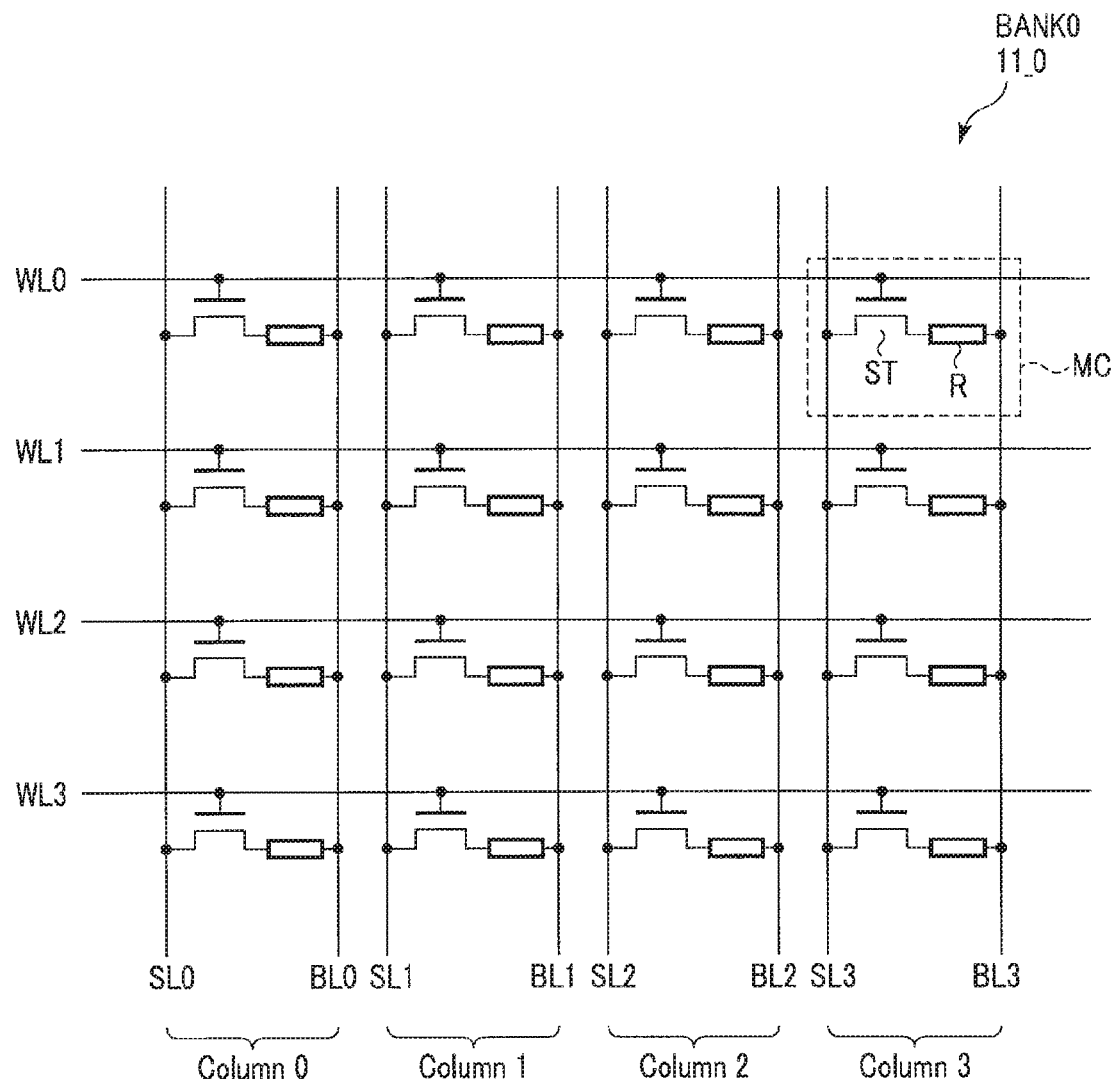
FIG. 2 shows a memory cell array of the semiconductor memory device according to the first embodiment.

FIG. 2 shows a memory cell array 11_0 of the semiconductor memory device according to the first embodiment.

As shown in FIG. 2, on the memory cell array 11_0 are provided bit lines BL (BL0 to BL3), source lines SL (SL0 to SL3), and word lines WL (WL0 to WL3). The bit lines BL and the source lines SL extend in a first direction, and are arranged alternately in a second direction which is orthogonal to the first direction. The word lines WL extend in the second direction. A memory cell array 10 comprises a plurality of memory cells MC. Each of the memory cells MC is provided at a position where the bit lines BL and the source lines SL intersect with the word lines WL.

Therefore, the plurality of memory cells MC are arrayed matrix-like in the first direction and the second direction. Here, the bit line BL0 and the source line SL0 will be considered as column 0, the bit line BL1 and the source line SL1 will be considered as column 1, the bit line BL2 and the source line SL2 will be considered as column 2, and the bit line BL3 and the source line SL3 will be considered as column 3.

The numbers of bit lines BL, source lines SL, and word lines WL in the memory cell array 11_0 and the column are only an example, therefore, are not limited thereto.

The memory cell MC includes, for example, a variable resistance element R and a select transistor ST. One end of the variable resistance element R is electrically coupled to bit line BL, and the other end thereof is electrically coupled to one end of the select transistor ST. The other end of the select transistor ST is electrically coupled to the source line SL, and the gate of the select transistor ST is electrically coupled to the word line WL.

The variable resistance element R is an element whose resistance value varies by applying a current (or voltage). The variable resistance element R includes, for example, an MTJ element, a phase change element, and a ferroelectric element. The memory cell MC is selected when the select transistor ST is turned on by the word line WL. Herein, a case in which the MRAM is adopted, that is, the variable resistance element R is an MTJ element, will be explained.

FIG. 3A is a cross-sectional view of an outline configuration of the variable resistance element R in the semiconductor memory device according to the first embodiment. Herein, as a variable resistance element R, a storage layer 31, a tunnel barrier layer 32, and a reference layer 33 are mainly presented.

As shown in FIG. 3A, the variable resistance element R comprises a laminated body comprised of the storage layer 31 which is a ferromagnetic layer, the reference layer 33 which is a ferromagnetic layer, and the tunnel barrier layer 32 which is a non-magnetic layer formed therebetween.

The storage layer 31 is a ferromagnetic layer in which a magnetization direction is variable, and has perpendicular magnetic anisotropy which is perpendicular or almost perpendicular to a film surface (upper surface/lower surface). Here, a variable magnetization direction means that a magnetization direction varies with respect to a predetermined write current. Furthermore, almost perpendicular means that a remanent magnetization direction falls within the range of 45<θ≤90 with respect to a film surface. The storage layer 31 is made of, for example, cobalt-iron-boron (CoFeB) or boronized iron (FeB).

The tunnel barrier layer 32 is formed on the storage layer 31. The tunnel barrier layer 32 is a non-magnetic layer, and is made of, for example, MgO.

The reference layer 33 is formed on the tunnel barrier layer 32. The reference layer 33 is a ferromagnetic layer in which a magnetization direction is not variable, and has perpendicular magnetic anisotropy which is perpendicular to or almost perpendicular to the film surface. Here, a non-variable magnetization direction means that a magnetization direction does not vary with respect to a predetermined write current. In other words, the reference layer 33 has a greater inverted energy barrier in the magnetization direction than what the storage layer 31 has. The reference layer 33 is made of, for example, cobalt platinum (CoPt), cobalt nickel (CoNi), or cobalt palladium (CoPd).

FIG. 3B is a diagram to explain a write at the variable resistance element R in the semiconductor memory device according to the first embodiment, and is a cross-sectional view of the variable resistance element in a parallel state (P state). FIG. 3C is a diagram to explain a write at the variable resistance element R in the semiconductor memory device according to the first embodiment, and is a cross-sectional view of the variable resistance element in an anti-parallel state (AP state).

The variable resistance element R is, for example, a spin injection type variable resistance element. Accordingly, when data is written to the variable resistance element R, or data is read from the variable resistance element R, a current is fed in both directions perpendicular to the film surface in the variable resistance element R.

More specifically, data is written to the variable resistance element R in the following manner.

As shown in FIG. 3B, when a current flows from the storage layer 31 to the reference layer 33, in other words, when electrons flowing from the reference layer 33 to the storage layer 31 are supplied, the electrons which are spin-polarized in the same direction as the magnetization direction of the reference layer 33 are injected to the storage layer 31. In this case, the magnetization direction of the storage layer 31 is adapted to the same direction as the magnetization direction of the reference layer 33. By doing so, the magnetization direction of the reference layer 33 and the magnetization direction of the storage layer 31 will be in a parallel arrangement. When in this parallel state, a resistance value of the variable resistance element R becomes the lowest. For example, this case is defined as "0" data.

On the other hand, as shown in FIG. 3C, when a current flows from the storage layer 33 to the reference layer 31, in other words, when electrons flowing from the storage layer 31 to the reference layer 33 are supplied, the electrons which are reflected by the reference layer 33 and spin-polarized in a direction opposite to the magnetization direction of the reference layer 33 are injected to the storage layer 31. In this case, the magnetization direction of the storage layer 31 is adapted to a direction opposite to the magnetization direction of the reference layer 33. Accordingly, the magnetization direction of the reference layer 33 and the magnetization direction of the storage layer 31 are in an anti-parallel arrangement. When in this anti-parallel state, the resistance value of the variable resistance element R becomes the highest. For example, this case is defined as "1" data.

Data is read from the variable resistance element R in the following manner.

A read current is supplied to the variable resistance element R. This read current is set to a value at which the magnetization direction of the storage layer 31 would not be inverted (i.e., a value smaller than a write current). By detecting a resistance value of the variable resistance element R at this point, the "0" data and the "1" data can be read.

Once again, as shown in FIG. 1, the row decoder 12_0 selects the word line WL in accordance with a row address. The column decoder 14_0 selects the bit line BL and the source line SL in accordance with a column address.

The read/write circuit 13_0 controls writing to the memory cell array 11_0 and reading from the memory cell array 11_0. The read/write circuit 13_0 includes elements such as a write driver, a page buffer, and a sense amplifier. The write driver, in the write, applies a write voltage to the memory cell MC and feeds a write current. The sense amplifier, in the read, senses the read current or the read voltage applied to the memory cell MC. The page buffer, when writing and reading data, temporarily stores data in units of writing to the memory cell MC and data in units of reading from the memory cell MC.

FIG. 4 is a block diagram showing the memory cell array 11 and the read/write circuit 13 in the semiconductor memory device according to the first embodiment. Herein, only the page buffer is shown as the read/write circuit 13. Furthermore, one memory cell MC is shown in each column.

As shown in FIG. 4, the memory cell array 11_0 has a memory cell MC (MC0 to MC3) for each column (column 0 to column 3). The read/write circuit 13_0 has a page buffer region 13A. The page buffer region 13A has a volatile page buffer PB (PB0 to PB3) for each column. Each of the page buffers PB0 to PB3 is electrically coupled to each of the memory cells MC0 to MC3 via each of switches SW0 to SW3. Each of the page buffers PB0 to PB3, in the write, stores data DQ from the data circuit 15. Each of the page buffers PB0 to PB3 transfers the data DQ to each of the memory cells MC0 to MC3 at a predetermined timing by setting each of the switches SW0 to SW3 on. The switches SW0 to SW3 turn on by using data transfer signal DT (a pulse or a rise) described later as a trigger.

Once again, as shown in FIG. 1, the input/output circuit 18 controls signals transmitted therebetween an external device (for example, a memory controller). More specifically, the input/output circuit 18 receives from the external device a command/address signal CA, data DQ, a data strobe signal DQS, and a clock CLK/CLKb. The input/output circuit 18 supplies the command and the address signal CA received from the external device to the command/address circuit 16. The input/output circuit 18 transfers the data DQ received from the external device to the data circuit 15. The input/output circuit 18 supplies various control signals to the controller 17.

The command/address circuit 16 receives the command/address signal CA from the input/output circuit 18, and supplies signals based on this to the banks BK0 to BK3. The command/address circuit 16 receives the clocks CLK and CLKb from the input/output circuit 18, and outputs various signals at a timing based on the clocks CLK and CLKb.

The data circuit DQ receives the data DQ from the input/output circuit 18, and transfers this to the banks BK0 to BK3.

The controller 17 includes elements such as a voltage generating circuit, and controls each constituent element based on the control signal from the input/output circuit 18.

[Write in First Embodiment]

Figure 5:
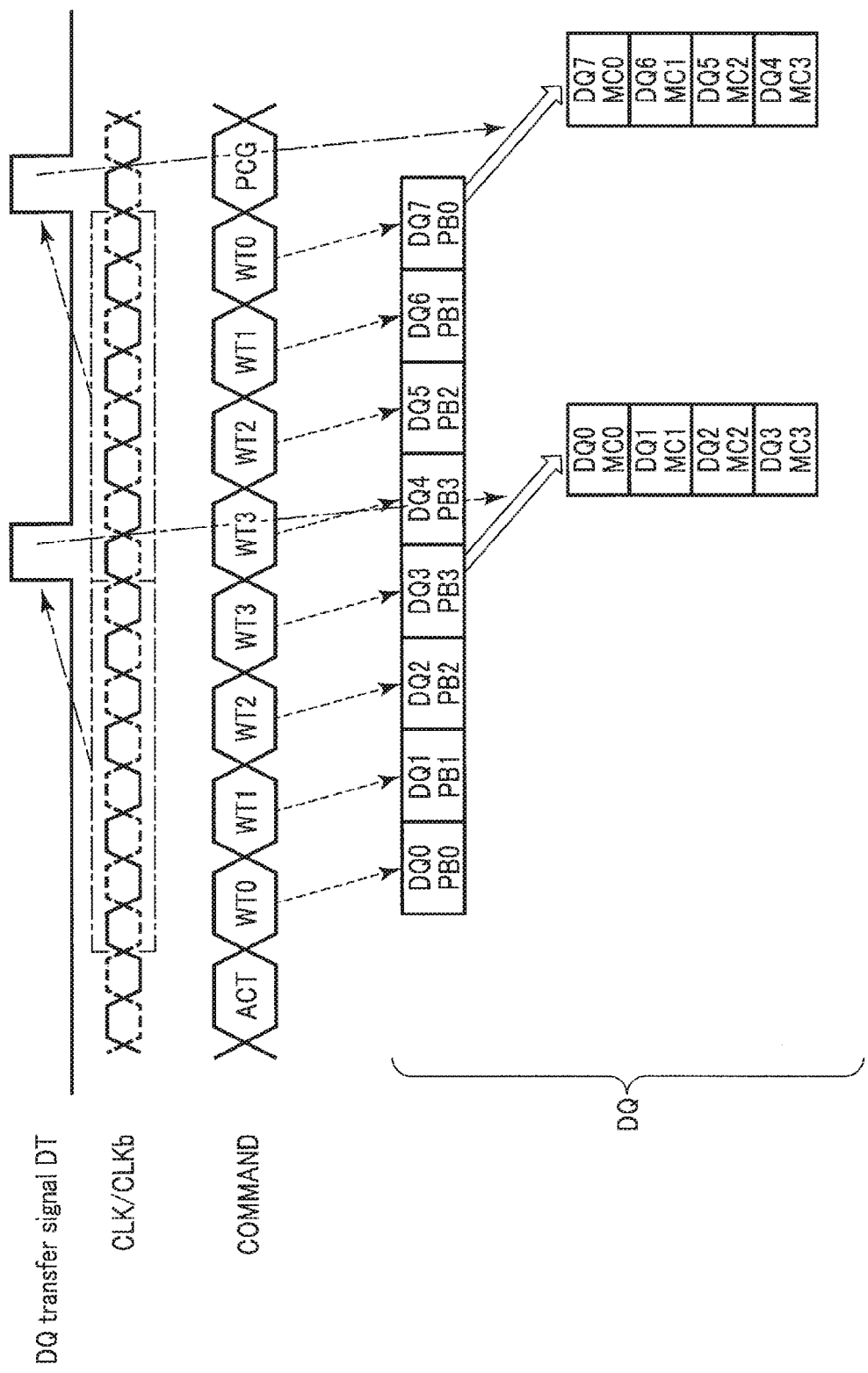
FIG. 5 is a timing chart showing a first example of the write at the semiconductor memory device according to the first embodiment.

FIG. 5 is a timing chart showing a first example of a write at the semiconductor memory device according to the first embodiment.

As shown in FIG. 5, the semiconductor memory device operates by receiving various commands based on the timing of the clock CLK/CLKb.

First of all, in the first example, an active command ACT is supplied to the semiconductor memory device. The active command ACT includes a bank address and a row address. The command/address circuit 16 activates a corresponding bank BK based on the bank address. The command/address circuit 16 transfers a row address to a row decoder 12 of the corresponding bank BK.

Subsequently, a write command WT0 is supplied to the semiconductor memory device. The write command WT0 includes a column address (address of column 0). The command/address circuit 16 transfers the column address to a column decoder 13 of the corresponding bank BK. Meanwhile, the data DQ0 is supplied to the semiconductor memory device with the write command WT0. The data circuit 15 transfers the data DQ0 to the page buffer PB0 based on the timing of receiving the write command WT0.

The write commands WT1 to WT3 are continuously supplied in sequence to the semiconductor memory device. The write commands WT1 to WT3 include column addresses (addresses of columns 1 to 3). Meanwhile, data DQ1 to DQ3 are supplied in sequence to the semiconductor memory device with the write commands WT1 to WT3. The data circuit 15 transfers the data DQ1 to the page buffer PB1 based on the timing of receiving the write command WT1, transfers the data DQ2 to the page buffer PB2 based on the timing of receiving the write command WT2, and transfers the data DQ3 to the page buffer PB3 based on the timing of receiving the write command WT3.

At this time, the command/address circuit 16 counts the number of clocks CLK/CLKb after the timing of receiving the write command WT0. When the number of counts of the clock CLK/CLKb reaches a predetermined number, the command/address circuit 16 sets a data transfer signal DT at H level for a short time (or an arbitrary time) (generates a pulse). Herein, when four clocks CLK/CLKb are received, the command/address circuit 16 sets the data transfer signal DT at H level. Based on this pulse of the data transfer signal DT, transferring the data DQ stored in the page buffer PB to the memory cell MC is started.

Herein, each of the data DQ0 to DQ3 of the page buffers PB0 to PB3 is transferred to each of the memory cells MC0 to MC3 in parallel.

Subsequently, the write command WT3 is supplied to the semiconductor memory device. Meanwhile, the data DQ4 is supplied to the semiconductor memory device with the write command WT3. The data circuit 15 transfers the data DQ4 to the page buffer PB3 based on the timing of receiving the write command WT3. Unlike the data DQ3, the data DQ4 is new data written to the memory cell MC3.

The write commands WT2 to WT0 are continuously supplied in sequence to the semiconductor memory device in a similar manner. Meanwhile, the data DQ2 to DQ0 are supplied to the semiconductor memory device in sequence with the write commands WT2 to WT0. The data circuit 15 transfers the data DQ2 to the page buffer PB2 based on the timing of receiving the write command WT2, transfers the data DQ1 to the page buffer PB1 based on the timing of receiving the write command WT1, and transfers the data DQ0 to the page buffer PB0 based on the timing of receiving the write command WT0.

At this time, the command/address circuit 16 counts the number of clocks CLK/CLKb after the timing of receiving the write command WT3 for the second time. When four clocks CLK/CLKb are received, the command/address circuit 16 sets the data transfer signal DT at H level for a short time (generates a pulse). Based on this pulse of the data transfer signal DT, transferring the data DQ stored in the page buffer PB to the memory cell MC is started. Herein, each of the data DQ4 to DQ7 of the page buffers PB3 to PB0 is transferred to each of the memory cells MC0 to MC3 in parallel.

Subsequently, a pre-charge command PCG is supplied to the semiconductor memory device. The command/address circuit 16 inactivates the corresponding bank BK based on the pre-charge command PCG.

In the present example, when four clocks CLK/CLKb are received, the pulse of the data transfer signal DT is generated, however, the number of clocks CLK/CLKb is not limited thereto. The number of clocks CLK/CLKb should be set so that the interval for generating the pulse of the data transfer signal DT (interval of transferring data to the memory cell MC (interval of a transfer completion of the previous data and a transfer start of the subsequent data)) is equal to or longer than a recovery time. Usually, the magnetization direction of the reference layer 33 of the memory cell MC is inverted temporarily by the write. A recovery time is a time in which the magnetization direction of the reference layer 33 of the memory cell MC is inverted by the write.

In the present example, the number of clocks CLK/CLKb is equal to the number of write commands WT, but is not limited thereto. For example, one write command WT may be synchronized with two clocks CLK/CLKb.

FIG. 6 is a timing chart showing a second example of a write at the semiconductor memory device according to the first embodiment. The second example shows a case in which a plurality of write commands WT0 are supplied successively.

As shown in FIG. 6, in the second example, after the active command ACT is supplied to the semiconductor memory device, the write command WT0 (a first write command WT0) is supplied. The first write command WT0 includes a column address (an address of column 0). Meanwhile, the data DQ0 is supplied to the semiconductor memory device with the first write command WT0. The data circuit 15 transfers the data DQ0 to the page buffer PB0 based on the timing of receiving the first write command WT0.

Three write commands WT0 (a second write command WT0, a third write command WT0, and a fourth write command WT0) are continuously supplied to the semiconductor memory device in sequence in a similar manner. The second write command WT0 to the fourth write command WT0 include column addresses (an address of column 0). Meanwhile, the data DQ1 to DQ3 are supplied in sequence to the semiconductor memory device with the second write command WT0 to the fourth write command WT0. The data circuit 15 transfers the data DQ1 to the page buffer PB0 based on the timing of receiving the second write command WT0, transfers the data DQ2 to the page buffer PB0 based on the timing of receiving the third write command WT0, and transfers the data DQ3 to the page buffer PB0 based on the timing of receiving the third write command WT0. As a result, the page buffer PB0 stores the data DQ3 which was transferred last.

At this time, the command/address circuit 16 counts the number of clocks CLK/CLKb after the timing of receiving the first write command WT0. When four clocks CLK/CLKb are received, the command/address circuit 16 sets the data transfer signal DT at H level for a short time (generates a pulse). Based on this data transfer signal DT, transferring the data DQ stored in the page buffer PB to the memory cell MC is started. Herein, the data DQ3 of the page buffer PB0 is transferred to the memory cell MC0.

Subsequently, in the same manner as the first example, the write commands WT3 to WT0 are supplied to the semiconductor memory device in sequence. In this manner, the data DQ (DQ4 to DQ7) are transferred to the memory cells MC (MC3 to MC0) in parallel. Thus, the pre-charge command PCG is supplied to the semiconductor memory device, and the corresponding bank BK is inactivated based on the pre-charge command PCG.

[Effect in First Embodiment]

Usually, in a memory cell MC (a variable resistance element R), the reference layer 33 and an unillustrated shift cancel layer form a synthetic antiferromagnet structure, in which the magnetization directions are opposite. In this case, when a write is performed, the magnetization direction of the shift cancel layer causes the magnetization direction of the reference layer 33 to be inverted. Subsequently, after a predetermined time (recovery time) passes, the magnetization direction of the reference layer 33 is inverted again and returns to its original direction. However, if a write is performed before the reference layer 33 returns to its original magnetization direction (before the recovery time passes after the write), erroneous writing occurs. An example of erroneous writing is explained in detail in the following.

Figure 7:
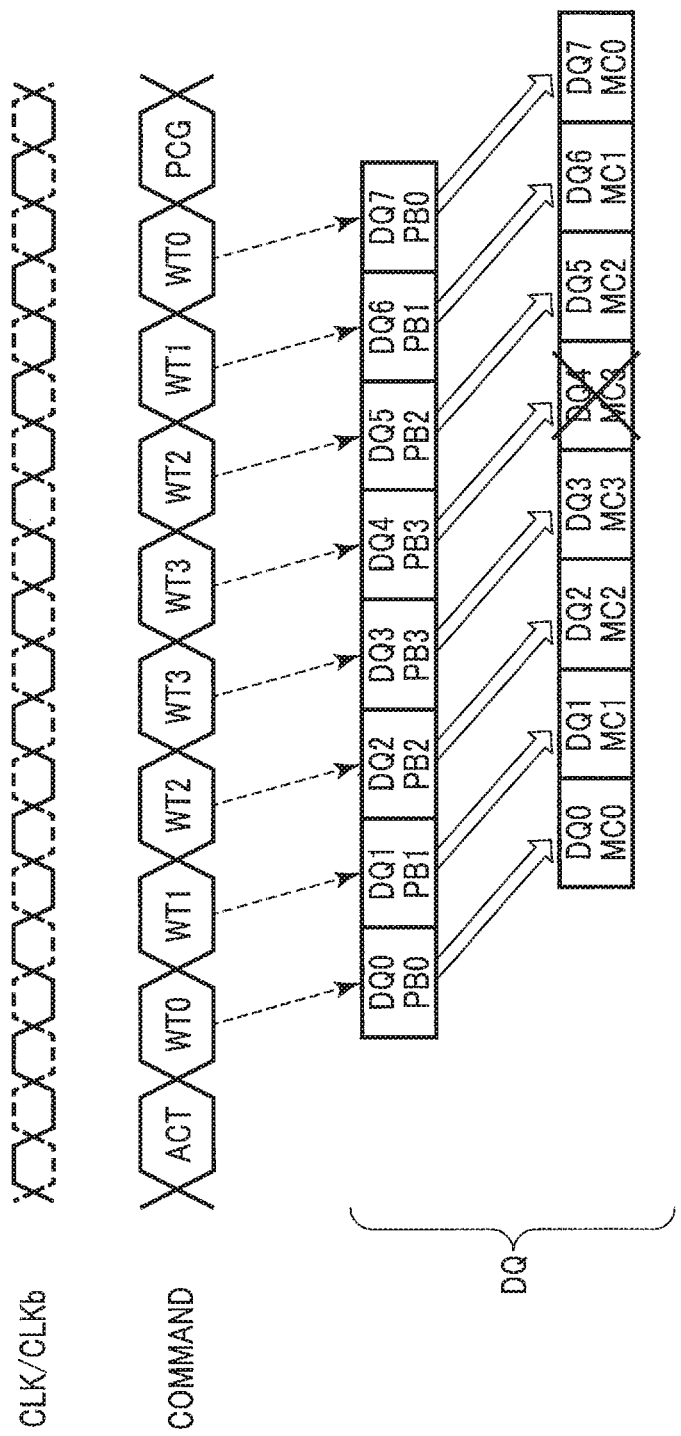
FIG. 7 is a timing chart showing a write at the semiconductor memory device according to a first comparative example.

FIG. 7 is a timing chart showing a write at the semiconductor memory device according to a first comparative example.

As shown in FIG. 7, in the first comparative example, the data circuit 15 transfers the data DQ0 to the page buffer PB0 based on the timing of receiving the write command WT0. The data DQ0 transferred to the page buffer PB0 is transferred continuously to the memory cell MC0. In a similar manner, each of the data DQ transferred to the page buffers PB1 to PB3 is continuously transferred to each of the memory cells MC1 to MC3.

At this time, for example, when the write command WT3 was continuous, first, the data DQ3 is transferred to the page buffer 3, then transferred to the memory cell MC3 continuously. Subsequently, after the data DQ4 is transferred to the page buffer 3, the data DQ4 is transferred to the memory cell MC3 continuously. In other words, the write to the memory cell MC 3 is performed twice, consecutively, in a short time. Therefore, as mentioned above, if the write of the data DQ4 to the memory cell MC 3 is performed before the lapse of recovery time after the write of the data DQ3, erroneous writing occurs.

In order to solve the above erroneous writing, a method of transferring the data DQ of all of the page buffers PB in parallel to the memory cell MC based on, for example, the pre-charge command PCG supplied last, may be considered. However, in this method, as a result of increasing the number of memory cells MC written in parallel, the write current increases, i.e., causing power-supply noise to increase and causing a writing failure.

In contrast, in the above first embodiment, as shown in FIG. 5, the data DQ is transferred to each of the page buffers PB0 to PB3 based on the timing of the write commands WT0 to WT3 received in sequence. The data DQ of each of the page buffers PB0 to PB3 is transferred in parallel to each of the memory cells MC0 to MC3 based on the pulse of the data transfer signal DT. The pulse of the data transfer signal DT is based on the number of clocks CLK/CLKb and indicates the timing at which the data DQ has been transferred to a predetermined nth page buffer PB (in FIG. 5, the fourth page buffer PB3). In this manner, even in a case where the same write command WT (for example, WT3) appears consecutively, data transfer to the same memory cell MC (for example, MC3) would not be performed consecutively in a short time, and would be performed after a predetermined lapse of time. In this manner, sufficient recovery time of the reference layer 33 from the previous write to the subsequent write may be secured, and erroneous writing may be prevented. Furthermore, power-supply noise can be reduced and the problem of writing failure may also be suppressed compared to the case in which the data DQ of all of the page buffers PB are transferred in parallel to the memory cells MC based on the pre-charge command PCG.

Figure 8:
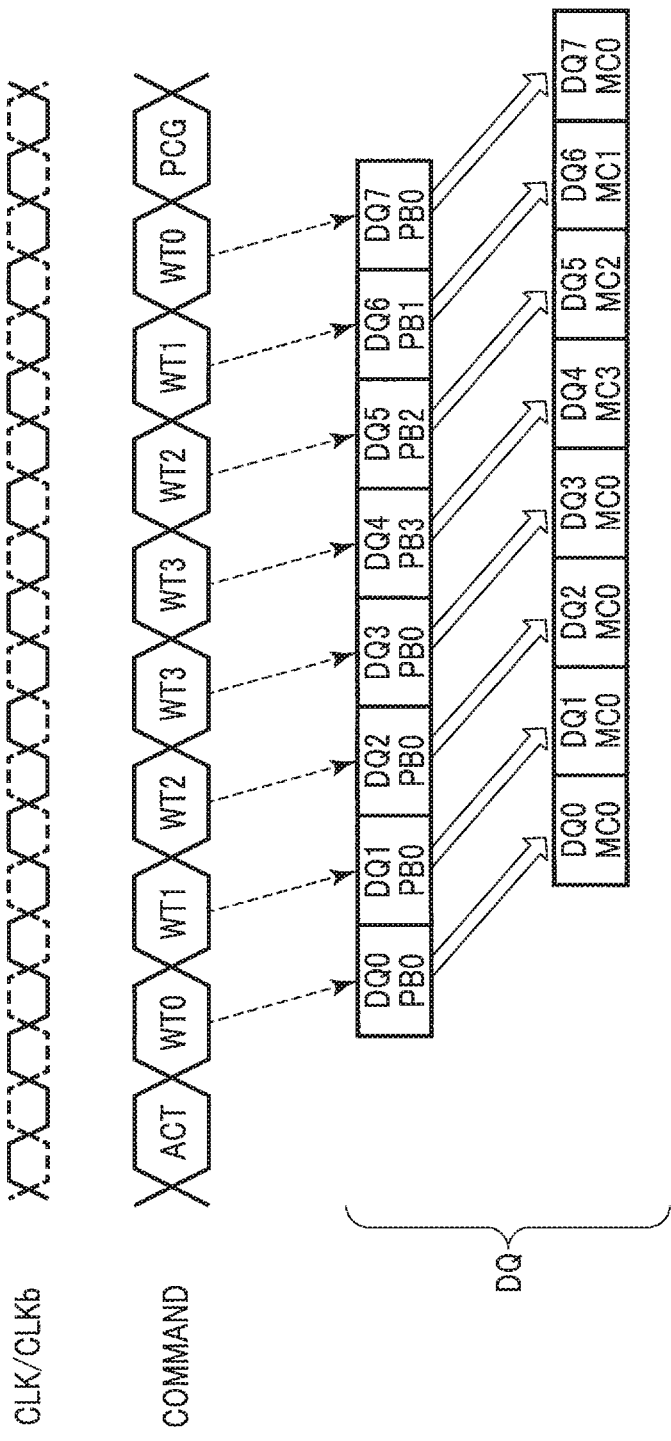
FIG. 8 is a timing chart showing a write at the semiconductor memory device according to a second comparative example.

FIG. 8 is a timing chart showing a write at the semiconductor memory device according to a second comparative example.

As shown in FIG. 8, in the second comparative example, the data circuit 15 transfers the data DQ to the page buffer PB0 based on the timing of receiving a first write command WT0. The data DQ0 transferred to the page buffer PB0 is transferred continuously to the memory cell MC0. Similarly, the data circuit 15 transfers the data DQ1 to the page buffer PB0 and the memory cell MC0 based on the timing of receiving a second write command WT0, transfers the data DQ2 to the page buffer PB0 and the memory cell MC0 based on the timing of receiving a third write command WT0, and transfers the data DQ3 to the page buffer PB0 and the memory cell MC0 based on the timing of receiving a fourth write command WT0. Finally, the data DQ3 is written on the memory cell MC0.

In this manner, in the case where the write command WT0 is successive, the write to the memory cell MC0 is performed the number of times equal to the number of the write commands WT0. Therefore, the number of writes to the memory cell MC0 increases, deteriorating the reliability of the memory cell MC0.

In contrast, in the above first embodiment, as shown in FIG. 6, the data DQ (DQ0, DQ1, DQ2, DQ3) is transferred to the page buffer PB0 based on the timing of the write command WT0 received in sequence (first write command WT0, second write command WT0, third write command WT0, fourth write command WT0). As a result, the page buffer PB0 stores the data DQ3 transferred last. Based on the pulse of the data transfer signal DT, the data DQ3 of the page buffer PB0 is transferred to the memory cell MC0. In other words, even in the case where the same write command WT (for example, WT0) continues, the number of writes (the number of transfers) to the same memory cell MC (for example, MC0) may be reduced. In this manner, deterioration in the reliability of the memory cell MC may be suppressed.

[Modification in First Embodiment]

FIG. 9 is a timing chart showing a modified example of the write operation of the semiconductor memory device according to the first embodiment. In the modification, a first data transfer signal DT1 and a second data transfer signal DT2 are generated. The data DQ is transferred to the memory cell MC not based on the pulses thereof but based on a rise to an H level. The modification will be explained in detail below.

As shown in FIG. 9, in the modification, after an active command ACT is supplied to the semiconductor memory device, a write command WT0 (a first write command WT0) is supplied. The first write command WT0 includes a column address (an address of column 0). Meanwhile, data DQ0 is supplied to the semiconductor memory device with the first write command WT0. The data circuit 15 transfers the data DQ0 to a page buffer PB0 based on the timing of receiving the first write command WT0.

Continuously, in a similar manner, write commands WT1 to WT3 are supplied to the semiconductor memory device in sequence. The write commands WT1 to WT3 include a column address (addresses of columns 1 to 3). Meanwhile, data DQ1 to DQ3 are supplied to the semiconductor memory device with the write commands WT1 to WT3. The data circuit 15 transfers the data DQ1 to a page buffer PB1 based on the timing of receiving the write command WT1, transfers the data DQ2 to a page buffer PB2 based on the timing of receiving the write command WT2, and transfers the data DQ3 to a page buffer PB3 based on the timing of receiving the write command WT3.

At this time, the command/address circuit 16 counts the number clocks CLK/CLKb thereafter the timing of receiving the write command WT0. When the number of counts of the clock CLK/CLKb reaches a predetermined number, the command/address circuit 16 sets the first data transfer signal DT1 to the H level. Herein, when four clocks CLK/CLKb are received, the command/address circuit 16 sets the first data transfer signal DT1 to the H level. Based on the rise of this first data transfer signal DT1, the data DQ stored in the page buffer PB starts to be transferred to the memory cell MC. Herein, each of the data DQ0 to DQ3 of the page buffers PB0 to PB3 is transferred to each of the memory cells MC0 to MC3 in parallel.

Subsequently, the write command WT3 is supplied to the semiconductor memory device. Meanwhile, data DQ4 is supplied to the semiconductor memory device with the write command WT3. The data circuit 15 transfers the data DQ4 to the page buffer PB3 based on the timing of receiving the write command WT3.

Continuously, in a similar manner, the write commands WT2 to WT0 are supplied to the semiconductor memory device in sequence. Meanwhile, the data DQ2 to DQ0 are supplied to the semiconductor memory device with the write commands WT2 to WT0. The data circuit 15 transfers the data DQ2 to the page buffer PB2 based on the timing of receiving the write command WT2, transfers the data DQ1 to a page buffer PB1 based on the timing of receiving the write command WT1, and transfers the data DQ0 to a page buffer PB0 based on the timing of receiving the write command WT0.

At this time, the command/address circuit 16 counts the number of clocks CLK/CLKb thereafter the timing of receiving the second write command WT3. When four clocks CLK/CLKb are received, the command/address circuit 16 sets the second data transfer signal DT2 to the H level. Based on the rise of this second data transfer signal DT2, the data DQ stored in the page buffer PB starts to be transferred to the memory cell MC. Herein, each of the data DQ4 to DQ7 of the page buffers PB3 to PB0 is transferred to each of the memory cells MC3 to MC0 in parallel.

Subsequently, a pre-charge command PCG is supplied to the semiconductor memory device. The command/address circuit 16 inactivates a corresponding bank BK based on the pre-charge command PCG.

<Second Embodiment>

In the following, FIG. 10 will be used to explain a semiconductor memory device according to a second embodiment. The second embodiment is different from the above first embodiment in that a pulse of a data transfer signal DT is generated based on the number of write commands WT.

In the second embodiment, explanations on the matters which are the same as in the first embodiment are omitted, and matters which are different are mainly explained.

<Write in Second Embodiment>

FIG. 10 is a timing chart showing a write at the semiconductor memory device according to the second embodiment.

As shown in FIG. 10, in the second embodiment, after the active command ACT is supplied, the write command WT0 is supplied to the semiconductor memory device. The write command WT0 includes a column address (an address of column 0). Meanwhile, the data DQ0 is supplied to the semiconductor memory device with the write command WT0. The data circuit 15 transfers the data DQ0 to the page buffer PB0 based on the timing of receiving the write command WT0.

In a similar manner the write command WT1 is continuously supplied to the semiconductor memory device. Meanwhile, the data DQ1 is supplied to the semiconductor memory device with the write command WT1. The data circuit 15 transfers the data DQ1 to the page buffer PB1 based on the timing of receiving the write command WT1.

Subsequently, after a given lapse of time, in a similar manner the write commands WT2 to WT3 are supplied to the semiconductor memory device. Meanwhile, the data DQ2 to DQ3 are supplied to the semiconductor memory device with the write commands WT2 to WT3. The data circuit 15 transfers the data DQ2 to the page buffer PB2 based on the timing of receiving the write command WT2, and transfers the data DQ3 to the page buffer PB3 based on the timing of receiving the write command WT3.

At this time, the command/address circuit 16 counts the number of write commands WT after the timing of receiving the write command WT0. When the number of counts of the write commands WT reaches a predetermined number, the command/address circuit 16 sets a data transfer signal DT at H level for a short time (generates a pulse). Herein, the command/address circuit 16 sets the data transfer signal DT at H level when four write commands WT are received. Based on this pulse of the data transfer signal DT, transferring the data DQ stored in the page buffer PB to the memory cell MC is started. Herein, each of the data DQ0 to DQ3 of the page buffers PB0 to PB3 is transferred to each of the memory cells MC0 to MC3 in parallel.

Subsequently, in the same manner as in the first embodiment, the write commands WT3 to WT0 are supplied to the semiconductor memory device in sequence. In this manner, the data DQ (DQ4 to DQ7) is transferred to the memory cells MC (MC3 to MC0) in parallel. The pre-charge command PCG is supplied to the semiconductor memory device, and the corresponding bank BK is inactivated based on the pre-charge command PCG.

In the present example, when four write commands WT are received, the data transfer signal DT is generated. However, the number of write commands WT is not limited thereto. The number of write commands WT should be set so that the interval for generating pulse of the data transfer signal DT (the interval of transferring data to the memory cell MC) is equal to or longer than the recovery time.

[Effect in Second Embodiment]

The second embodiment can produce the same effect as the first embodiment.

According to the second embodiment, each of the data DQ of the page buffers PB0 to PB3 is transferred in parallel to each of the memory cells MC0 to MC3 based on the pulse of the data transfer signal DT. The pulse of the data transfer signal DT is based on the number of write commands WT and indicates the timing at which the data DQ has been transferred to a predetermined nth page buffer PB (herein, the fourth page buffer PB3). In this manner, even in the case where the write command WT is supplied discontinuously (with an optional time interval), the number of memory cells MC to which the data DQ is transferred in parallel can be made constant. In this manner, the write characteristic may be made constant, which would facilitate write control. Furthermore, for example, even in the case where the same write command WT continues, the number of writes to the same memory cell MC (the number of transfers) can be further reduced. In this manner, deterioration in the reliability of the memory cell MC may be suppressed.

While certain embodiments have been described, these embodiments have been presented by way of example only, and are not intended to limit the scope of the claims. Indeed, the novel methods and systems described herein may be embodied in a variety of other forms; furthermore, various omissions, substitutions and changes in the form of the methods and systems described herein may be made without departing from the spirit of the embodiments. The accompanying claims and their equivalents are intended to cover such forms or modifications as would fall within the scope and spirit of the embodiments.

What is claimed is:

1. A magnetic random access memory comprising:
   a first memory cell including a first variable resistance element;
   a first buffer coupled to the first memory cell;
   a second memory cell including a second variable resistance element; and
   a second buffer coupled to the second memory cell,
   wherein in a write operation:
   first data is stored in the first buffer when the memory receives a first write command and the first data,
   second data is stored in the second buffer and is transferred to the second memory cell when the memory receives a second write command and the second data after the memory receives the first write command and the first data, and
   the first data in the first buffer and the second data in the second buffer are transferred to the first memory cell and the second memory cell respectively when a first signal is generated a predetermined time after the memory receives the first write command, and
   wherein:
   the first variable resistance element and the second variable resistance element each include a first magnetic layer, a second magnetic layer, and a first non-magnetic layer provided between the first magnetic layer and the second magnetic layer,
   the second magnetic layer has a greater inverted energy barrier in a magnetization direction than the first magnetic layer has,
   when transferring the first data and the second data, a magnetization direction of the second magnetic layer is inverted for a first time, and
   the first time is shorter than a second time which is a time after the first signal is generated and before the second signal is generated.

2. The memory of claim 1, wherein in the write operation:
   third data is stored in the second buffer when the memory receives a third write command and the third data after the first data and the second data are transferred to the first memory cell and the second memory cell respectively,
   fourth data is stored in the first buffer when the memory receives a fourth write command and the fourth data after the memory receives the third write command and the third data, and
   the third data in the second buffer and the fourth data in the first buffer are transferred to the second memory cell and the first memory cell respectively when a second signal is generated a predetermined time after the memory receives the third write command.

3. The memory of claim 1, wherein the transferring the first data is executed in parallel, at least in part, with the transferring the second data.

4. The memory of claim 1, wherein the first signal is generated based on a predetermined number of clock signals received from outside after the memory receives the first write command.

5. The memory of claim 1, wherein the first signal is generated based on a predetermined number of write commands received from outside after the memory receives the first write command.

6. The memory of claim 2,
   wherein the transferring the third data and the fourth data is started at a timing after a lapse of a time from a later one between a transfer completion of the first data and a transfer completion of the second data.

7. A magnetic random access memory comprising:
a first memory cell comprising a first variable resistance element;
a first buffer coupled to the first memory cell;
a second memory cell comprising a second variable resistance element; and
a second buffer coupled to the second memory cell,
wherein in a write operation:
first data is stored in the first buffer when the memory receives a first write command and the first data,
second data is stored in the first buffer when the memory receives a second write command and the second data after the memory receiving the first write command and the first data,
the second data in the first buffer is transferred to the first memory cell when a first signal is generated according to a timing at which the memory receives the first write command, and
the first data is not transferred to the first memory cell when the first signal is generated a predetermined time after the memory receives the first write command, and
wherein:
the first variable resistance element and the second variable resistance element each include a first magnetic layer, a second magnetic layer, and a first non-magnetic layer provided between the first magnetic layer and the second magnetic layer,
the second magnetic layer has a greater inverted energy barrier in a magnetization direction than the first magnetic layer has,
when transferring the first data and the second data, a magnetization direction of the second magnetic layer is inverted for a first time, and
the first time is shorter than a second time which is a time after the first signal is generated and before the second signal is generated.

8. The memory of claim 7,
wherein in the write operation:
third data is stored in the second buffer when the memory receives a third write command and the third data after the first data is transferred to the first memory cell,
fourth data is stored in the first buffer when the memory receives a fourth write command and the fourth data after the memory receives the third write command and the third data, and
the third data in the second buffer and the fourth data in the first buffer are transferred to the second memory cell and the first memory cell respectively when a second signal is generated a predetermined time after the memory receives the third write command.

9. The memory of claim 7, wherein the first signal is generated based on a predetermined number of clock signals received from outside after the memory receives the first write command.

10. The memory of claim 7, wherein the first signal is generated based on a predetermined number of write commands received from outside after the memory receives the first write command.

* * * * *